(12) United States Patent
Berrian (10) Patent No.: US 6,833,552 B2
(45) Date of Patent: *Dec. 21, 2004

(54) SYSTEM AND METHOD FOR IMPLANTING A WAFER WITH AN ION BEAM

(75) Inventor: Donald W. Berrian, Topsfield, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/694,162

(22) Filed: Oct. 27, 2003

(65) Prior Publication Data

US 2004/0084636 A1 May 6, 2004

Related U.S. Application Data

(63) Continuation of application No. 09/768,409, filed on Jan. 24, 2001, now Pat. No. 6,677,599.
(60) Provisional application No. 60/192,268, filed on Mar. 27, 2000.

(51) Int. Cl.[7] .................. H01J 37/00; H01J 37/317; G01N 23/00
(52) U.S. Cl. .................. 250/492.3; 250/492.1; 250/492.2; 250/397; 250/398; 250/493.1; 250/492.22
(58) Field of Search .......................... 250/492.1, 492.2, 250/492.21, 492.22, 492.3, 493.1, 397, 398, 424, 425, 423 R, 441.11, 442.11

(56) References Cited

U.S. PATENT DOCUMENTS

| | | |
|---|---|---|
| 2,053,537 A | 9/1936 | Schlesinger |
| 2,108,091 A | 2/1938 | Ardenne |
| 2,260,725 A | 10/1941 | Richards et al. |
| 2,777,958 A | 1/1957 | Poole |
| 3,122,631 A | 2/1964 | Geerk et al. |
| 3,193,717 A | 7/1965 | Nunan |
| 3,569,757 A | 3/1971 | Brewer |

(List continued on next page.)

FOREIGN PATENT DOCUMENTS

| | | |
|---|---|---|
| DE | 1190266 | 4/1965 |
| JP | 5923024 | 12/1964 |
| JP | 6288246 | 11/1994 |
| WO | WO-88/02920 | 4/1988 |

*Primary Examiner*—John R. Lee
*Assistant Examiner*—David A. Vanore
(74) *Attorney, Agent, or Firm*—Boult Wade Tennant (57) ABSTRACT

A method is provided for uniformly implanting a wafer with an ion beam. The wafer is generally of the type with a surface area in the form of a disk with a diameter and center. The ion beam is first formed as an elongated shape incident on the wafer, the shape having a length along a first axis smaller than the diameter, and a width shorter than the length along a second axis. Next, the wafer is translated at a variable translational velocity in a direction substantially parallel with the second axis. The wafer is also rotated substantially about the center at a rotational velocity. These movements are made such that the ion beam implants the wafer with substantially uniform dose across the surface area of the wafer. The wafer is preferably translated such that the ion beam implants the wafer from one side of the wafer, across the surface area of the wafer, and through another side of the wafer, in a selected velocity versus position profile. The wafer is also tilted while rotating such that the ion beam implants the surface area at a substantially constant angle relative to a crystal axis of the wafer. The wafer can also be translated in a direction substantially parallel to the ion beam such that the ion beam implants the surface area with a substantially constant spot size. The methods of the invention also include determining beam current density of the ion beam, and adjusting the variable translational velocity, and rotational velocity, as a function of the current density.

10 Claims, 6 Drawing Sheets

U.S. PATENT DOCUMENTS

| | | |
|---|---|---|
| 3,689,766 A | 9/1972 | Freeman |
| 3,778,626 A | 12/1973 | Robertson |
| 3,816,748 A | 6/1974 | Harrison |
| 3,911,321 A | 10/1975 | Wardly |
| 4,017,403 A | 4/1977 | Freeman |
| 4,021,675 A | 5/1977 | Shifrin |
| 4,063,098 A | 12/1977 | Enge |
| 4,066,895 A | 1/1978 | Iwanaga |
| 4,117,339 A | 9/1978 | Wolfe |
| 4,140,913 A | 2/1979 | Anger et al. |
| 4,161,775 A | 7/1979 | Franz |
| 4,260,893 A | 4/1981 | Bakker et al. |
| 4,260,897 A | 4/1981 | Bakker et al. |
| 4,276,477 A | 6/1981 | Enge |
| 4,283,631 A | 8/1981 | Turner |
| 4,367,411 A | 1/1983 | Hanley et al. |
| 4,399,365 A | 8/1983 | Koike et al. |
| 4,420,691 A | 12/1983 | Zasio |
| 4,421,988 A | 12/1983 | Robertson et al. |
| 4,433,247 A | 2/1984 | Turner |
| 4,447,773 A | 5/1984 | Aston |
| 4,449,051 A | 5/1984 | Berkowitz |
| 4,469,948 A | 9/1984 | Veneklasen et al. |
| 4,476,393 A | 10/1984 | Taya et al. |
| 4,494,005 A | 1/1985 | Shibata et al. |
| 4,564,763 A | 1/1986 | Bruel et al. |
| 4,578,589 A | 3/1986 | Aitken |
| 4,587,432 A | 5/1986 | Aitken |
| 4,587,433 A | 5/1986 | Farley |
| 4,633,138 A | 12/1986 | Tokiguchi et al. |
| 4,661,712 A | 4/1987 | Mobley |
| 4,687,936 A | 8/1987 | McIntyre et al. |
| 4,745,281 A | 5/1988 | Enge |
| 4,804,852 A | 2/1989 | Rose et al. |
| 4,806,766 A | 2/1989 | Chisholm |
| 4,922,106 A | 5/1990 | Berrian et al. |
| 4,980,562 A | 12/1990 | Berrian et al. |
| 5,012,104 A | 4/1991 | Young |
| 5,053,627 A | 10/1991 | Ruffell et al. |
| 5,132,544 A | 7/1992 | Glavish |
| 5,198,676 A | 3/1993 | Benveniste et al. |
| 5,311,028 A | 5/1994 | Glavish |
| 5,406,088 A | 4/1995 | Brune et al. |
| 5,481,116 A | 1/1996 | Glavish et al. |
| 5,898,179 A | 4/1999 | Smick et al. |
| 6,429,442 B1 | 8/2002 | Tomita et al. |
| 6,677,599 B2 * | 1/2004 | Berrian .................. 250/492.3 |

* cited by examiner

FIG. 11

SYSTEM AND METHOD FOR IMPLANTING A WAFER WITH AN ION BEAM

RELATED APPLICATIONS

This application is a continuation of commonly-owned U.S. patent application Ser. No. 09/768,409, filed Jan. 24, 2001, now U.S. Pat. No. 6,677,599 which claims priority to U.S. Provisional Application No. 60/192,268, filed on Mar. 27, 2000 both of which are incorporated herein by reference.

FIELD OF THE INVENTION

The invention relates generally to ion implantation, and in particular to improving uniformity of ion beams on wafers during processing.

BACKGROUND OF THE INVENTION

To better understand the invention, U.S. Pat. Nos. 5,481,116, 4,980,562 and 4,922,106 are incorporated herein by reference as background.

Traditional single-wafer ion implanters either scan the beam across a stationary wafer or translate the wafer in one direction past a fan shaped ion beam or an ion beam scanned in a single axis. The process of scanning or shaping a uniform ion beam generally requires a complex and long beam line—which is undesirable at low energies. Traditional high-current ion implanters achieve a short beam line by placing a large number of wafers on a wheel and simultaneously spinning and radially translating the wheel through the ion beam. The multiple wafer wheel makes an ion implanter undesirably large. It was adopted to reduce heating effects; however that is unnecessary at low energies. There is thus the need to improve wafer scanning systems and methods.

One object of the invention is to provide a substantially uniform dose of ion beam implantation across the surface of a wafer during processing in an ion implanter. Other objects will be apparent in the description that follows.

SUMMARY OF THE INVENTION

In one aspect, the invention provides a method of uniformly implanting a wafer with an ion beam. The wafer is generally of the type with a surface area in the form of a disk with a diameter and center. The ion beam is first formed as an elongated shape incident on the wafer, the shape having a length along a first axis smaller than the diameter, and a width shorter than the length along a second axis. Next, the wafer is translated at a variable velocity in a direction substantially parallel with the second axis. The wafer is also rotated substantially about the center at a rotational velocity. These movements are made such that the ion beam implants the wafer with substantially uniform dose across the surface area of the wafer.

In another aspect, the wafer is translated such that the ion beam implants the wafer from one side of the wafer, across the surface area of the wafer, and through another side of the wafer, in a selected velocity versus position profile.

In still another aspect, the step of translating at a variable velocity includes moving the wafer at a greater velocity when the ion beam implants the center of the wafer and at a slower velocity when the ion beam implants an edge of the wafer.

In another aspect, the step of translating includes translating the wafer such that the ion beam implants from one side of the wafer to the center. Preferably, the ion beam is blanked when it reaches the center of the wafer. In addition, the wafer is then preferably declerated in a direction opposite to the scan direction.

The methods of the invention also include, in another aspect, the step of tilting the wafer while rotating the wafer such that the ion beam implants the surface area at a substantially constant angle relative to a crystal axis of the wafer. Preferably, the wafer of this aspect is translated in a direction substantially parallel to the ion beam such that the ion beam implants the surface area with a substantially constant spot size. In another aspect, the wafer is moved in the direction with a magnitude proportional to an impact location of the beam on the wafer relative to a plane perpendicular to the beam that passes through the center.

In yet another aspect, the method of the invention includes the step of determining beam current density of the ion beam. With this determination, the method also preferably includes the step of adjusting the variable velocity as a function of the current density. In another aspect, the method includes the step of adjusting the rotational velocity as a function of the current density.

Current density is preferably measured in two dimensions; and more preferably with a disk having a plurality of holes (and preferably one hole in each angular quadrant of the disk). In accord with the invention, the disk is moved similar to a wafer in translation and rotation while two-dimensional current density is determined. In one aspect, the disk has 4 equally spaced holes made about the disk center, though more holes can be used if desired.

In another aspect, the method of determining current density of the ion beam includes using a Faraday Cup to measure the current density. In one aspect, the disk is removed for direct calibration of the beam into the Cup.

These and other aspects and advantages of the invention are evident in the description which follows and in the accompanying drawings.

DETAILED DESCRIPTION OF THE INVENTION

Figure 1:
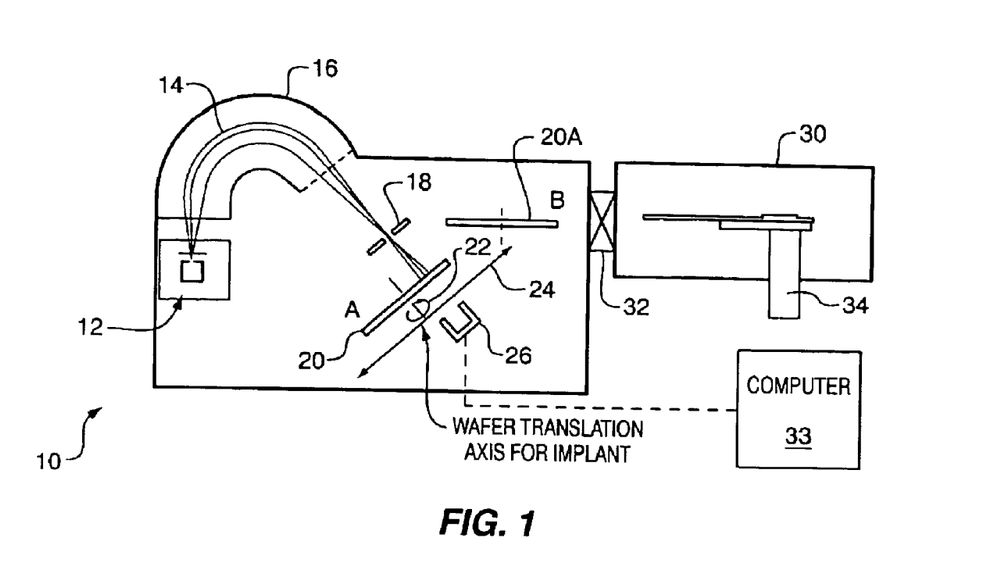
FIG. 1 illustrates an ion beam scanning system and cluster tool wafer handling mechanism constructed according to the invention.

FIG. 1 shows an ion beam scanning system 10 illustrating functional ion beam scan techniques of the invention. An ion source 12, such as a conventional Bernais source, generates a beam 14 adjusted for scan through analyzing magnet 16. A resolving slit 18 serves to adjust beam divergence to implant a wafer 20 at position A. To keep the current density low, the long axis 31 of the ion source slit (see FIG. 2) is parallel to the magnetic field in the analyzing magnet to ensure that beam 14 is wide throughout its entire path. Position B illustratively shows wafer 20a at a load position A prior to implant. During implantation by beam 14, wafer 20 is rotated and/or translated as shown by motion lines 22 and 24, respectively. A Faraday cup 26 serves to make measurements of ion beam density as discussed herein.

Figure 2:
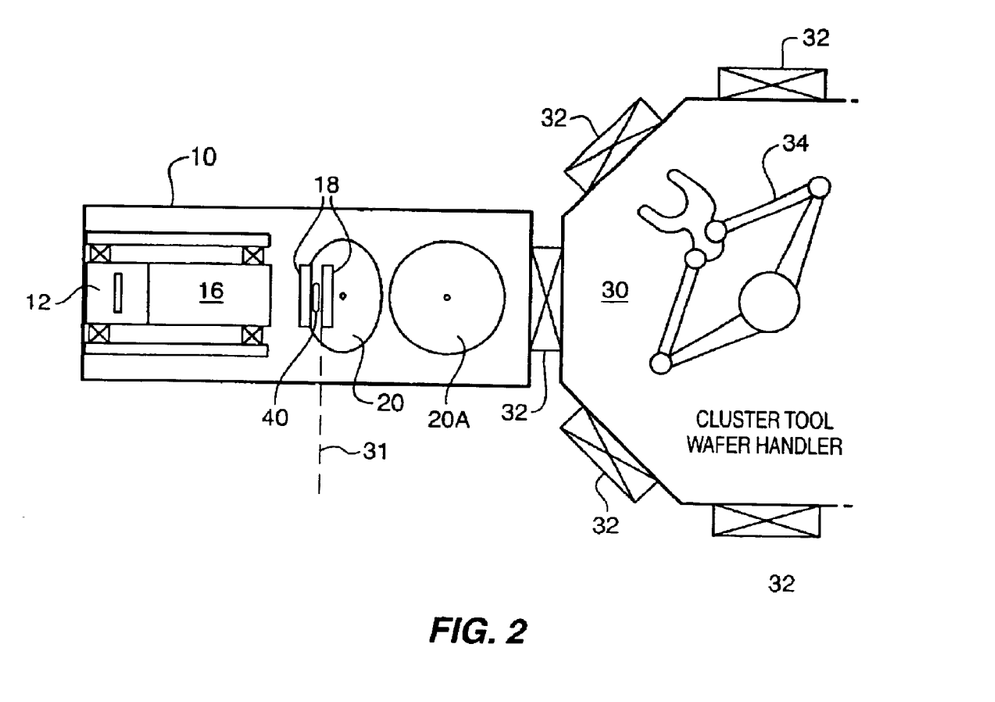
FIG. 2 shows a top view of the system and mechanism of FIG. 1.

Connected to system 10 is a cluster tool wafer handling mechanism 30, which provides wafers to, and removes wafers from, system 10. Mechanism 30 is known to those skilled in the art, and typically includes one or more load lock doors 32, and a robot transport 34 that moves wafers as commanded. FIG. 2 shows further detail of system 10 and mechanism 30 in a top view. In FIG. 2, wafer 20 is shown tilted relative to wafer 20a, such that the illumination spot 40 of ion beam 14 implants the desired surface area of wafer 20 through slit 18. Because of the small size of system 10, relative to the size of wafer 20, system 10 can be made small enough to fit on one site in a standard 300 mm cluster tool mechanism 30.

FIG. 1 also illustratively shows a computer 33 connected to an output of Faraday cup 26. Computer 33 is programmed to compile and collate current data from cup 26 to determine current density, as described herein.

Figure 3:
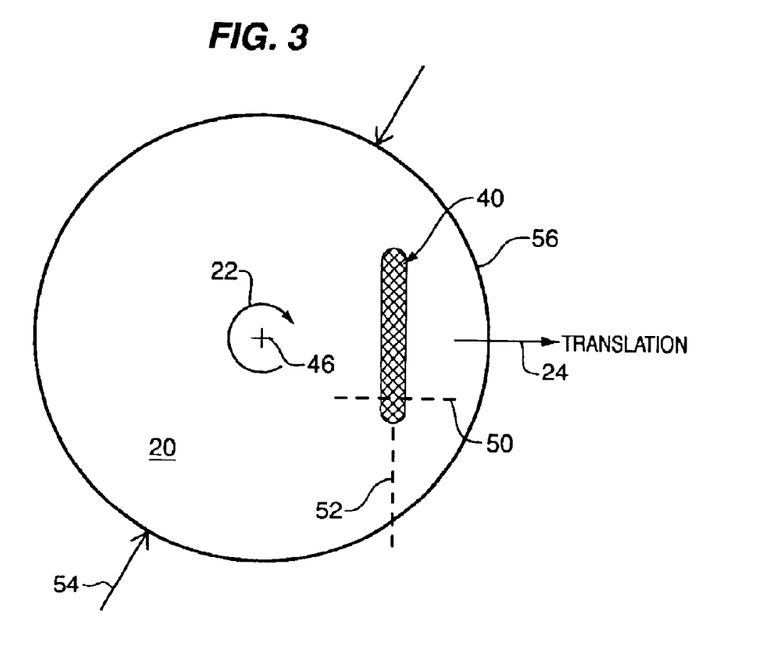
FIG. 3 illustrates implantation of a wafer with an ion beam in accord with the methods of the invention.
Figure 4:
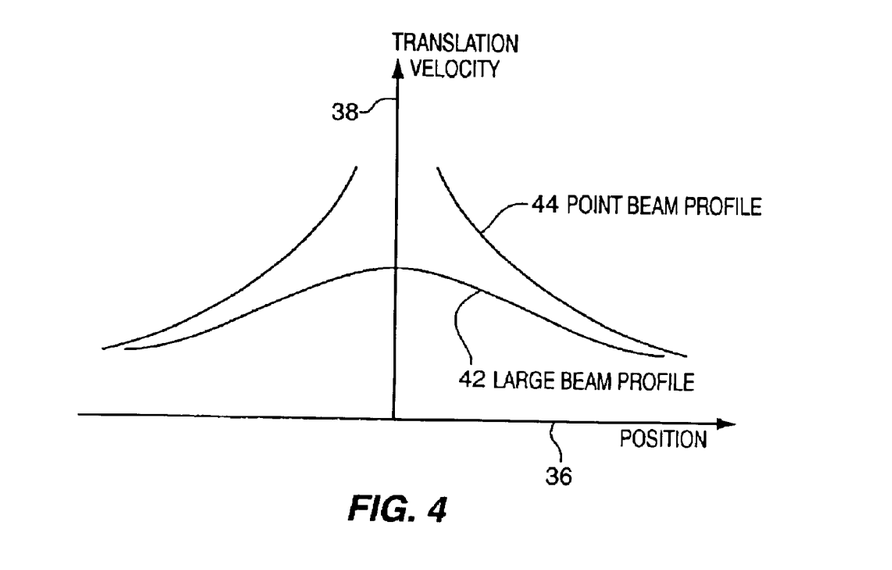
FIG. 4 graphically illustrates the translational velocity versus scan position for a wafer during implantation as a function of ion beam spot size.

FIG. 3 illustrates how wafer 20 is implanted by ion beam 14 to achieve the desired dose uniformity of the invention. Specifically, wafer 20 is rotated and translated (shown as motion lines 22, 24, respectively) during implantation by ion beam 14. Ion beam 14 illustratively forms an implantation spot 40 on wafer 20. The scan translational velocity and position of wafer 20 is graphically illustratively in FIG. 4 as a function of beam size. The "x" axis 36 of FIG. 4 refers to position while the "y" axis 38 refers to translational velocity. A larger ion beam generates a less dynamic position/ translation profile 42 as compared to a point beam, shown as profile 44. Profile 44 diverges at "0" position to illustrate the inverse relationship between spot size and translational velocity at the center 46 of wafer 20.

Figure 5:
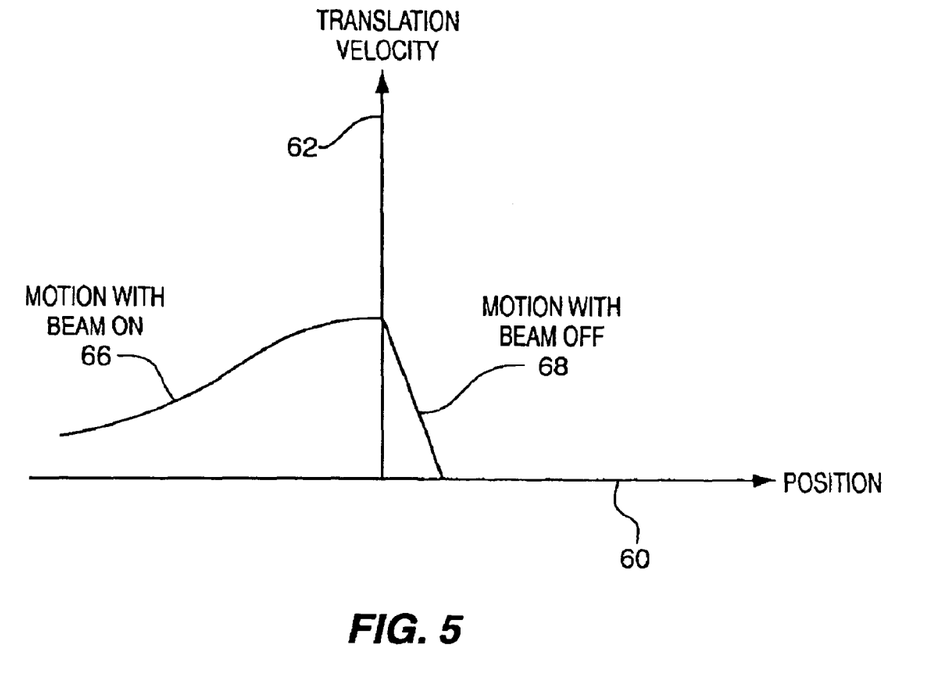
FIG. 5 graphically illustrates translational velocity versus scan position for a wafer during implantation from wafer edge to wafer center.

In FIG. 3, it is shown that the favored ion beam shape produces an implantation spot 40 in a fan shape which is narrow in one dimension 50 and wide in the cross-wise dimension 52, though not as wide as the diameter 54 of wafer 20. Ion beam 14 (FIG. 1) is thus preferably oriented such that wafer 20 is translated along dimension 50, minimizing translational velocity needed to keep the dose constant from wafer center 46 to wafer edge 56. As alternatives, wafer 20 can be scanned from edge 56 to edge 56, across diameter 54, or from edge 56 to center 46—each with a profile of FIG. 3. In either case, however, the velocity is greatest at wafer center 46, making it the most difficult location to stop and reverse; and so preferably wafer 20 is scanned as in FIG. 3 from edge 56 to edge 56 and across center 46. As an alternative, ion beam 14 is blanked when it reaches center 46 and then decelerated in a reverse direction, as shown in FIG. 5. Scanning in FIG. 5 preferably starts from wafer edge 56 to center 46, shown as profile 66, and then reversed in motion with ion beam 14 off, shown as profile 68. Preferably, ion beam 14 is blanked when it reaches center 46. Scanning with the profile of FIG. 5 avoids having to translate the full wafer diameter 54 and thereby cuts the length of the translation almost in half. In FIG. 5, position is again shown as "x" axis 60, while "y" axis 62 represents translational velocity.

Figure 6:
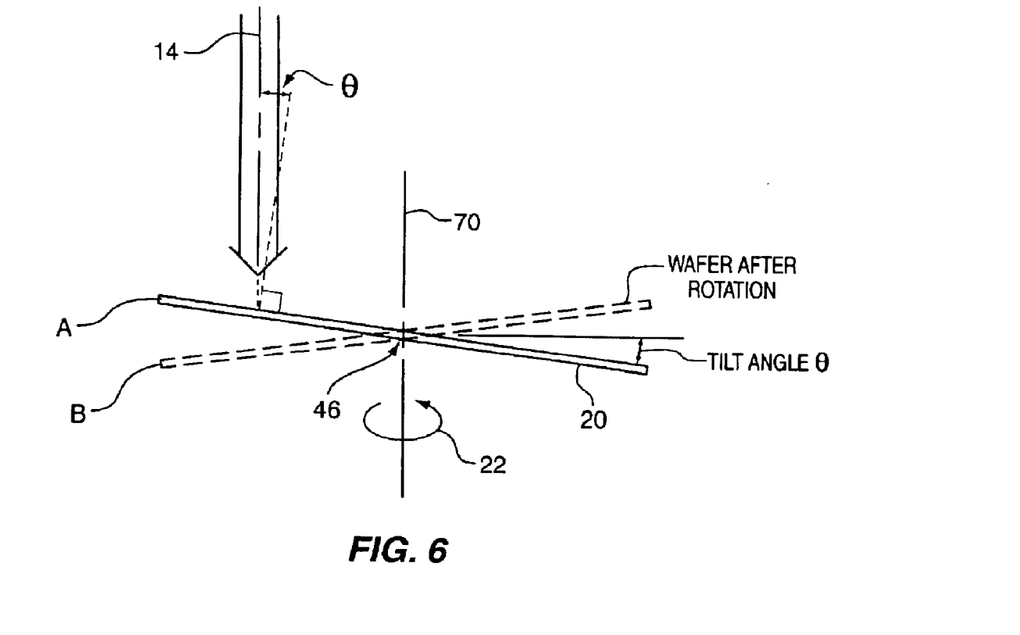
FIG. 6 illustrates rotation and tilting of a wafer in accord with the teachings of the invention.
Figure 7:
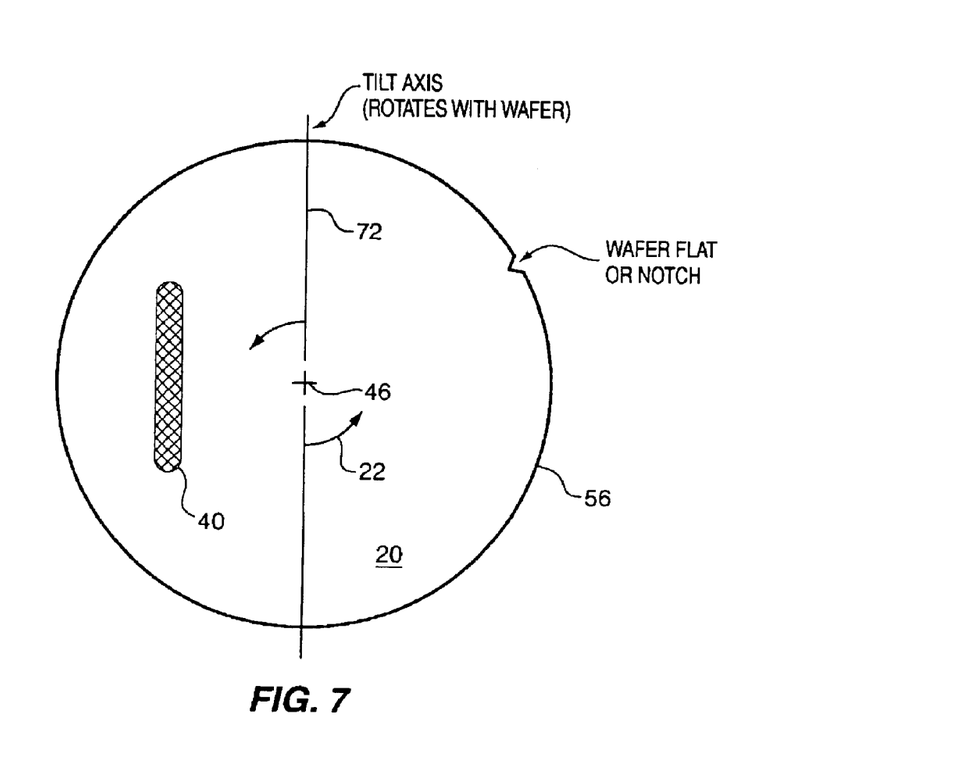
FIG. 7 illustrates a top view for a wafer such as in FIG. 6.

To reduce the amount of channeling, ion beam 14 is traditionally set to strike the wafer 20 at an angle theta of about seven degrees from vertical, as shown in FIG. 6. Angle theta orients beam 14 to crystals in wafer 20. This orientation however poses a problem since rotating wafer 20 in motion 22, about center 46, is not perpendicular to beam 14, causing angle theta to vary relative to the crystal axis with different translational positions of wafer 20. To avoid this, the axis of rotation 70 is kept parallel to beam 14 and the wafer is tilted during rotation. FIG. 6 illustratively shows wafer 20 in a first position A and in a second position B representing relative orientation of wafer 20 after 180 degrees in rotation, with an intended tilt adjustment. FIG. 7 shows wafer 20 from a top view; and specifically illustrates the intended tilt axis 72 useful in ensuring crystal orientation with beam 14. Tilt axis 72 rotates with rotation 22 of wafer 20.

Figure 8:
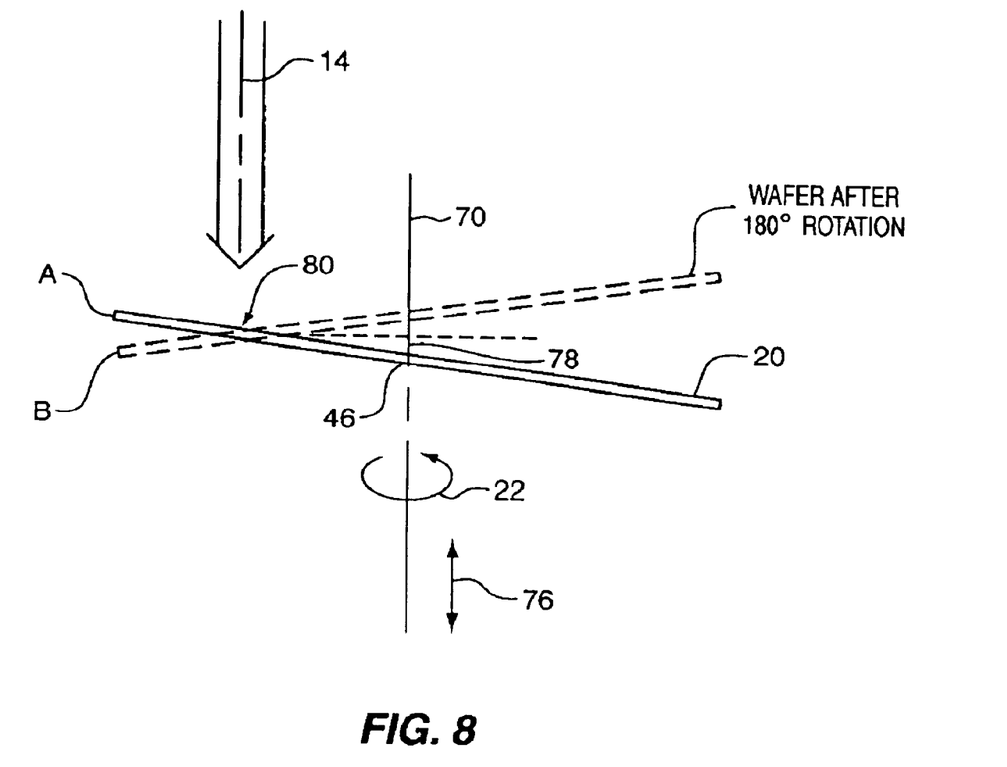
FIG. 8 illustrates translating and rotating a wafer in accord with the teachings of the invention.

However, in making the tilt of FIG. 6, a further problem is created: the implantation spot 40 varies in shape from one side of wafer 20 to the other because the beam travel distance to wafer 20 varies (specifically, due to beam divergence, the spot size 40 varies unless it strikes wafer 20 at the same distance from source 12). This spot size difference may not be enough to be significant, but if it is wafer 20 is also preferably translated vertically, shown in FIG. 8 as vertical movement line 76. Movement along line 76 is made to move wafer 20 up and down during rotation to keep the impact point of beam 14 on wafer 20 at the same distance; movement 76 has a magnitude 78 proportional to the distance from beam impact 80 to center 46.

Figure 9:
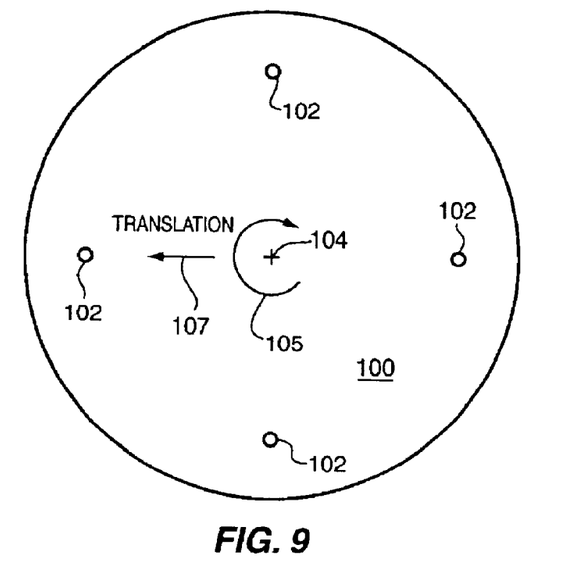
FIG. 9 shows an ion beam calibration disk of the invention.
Figure 10:
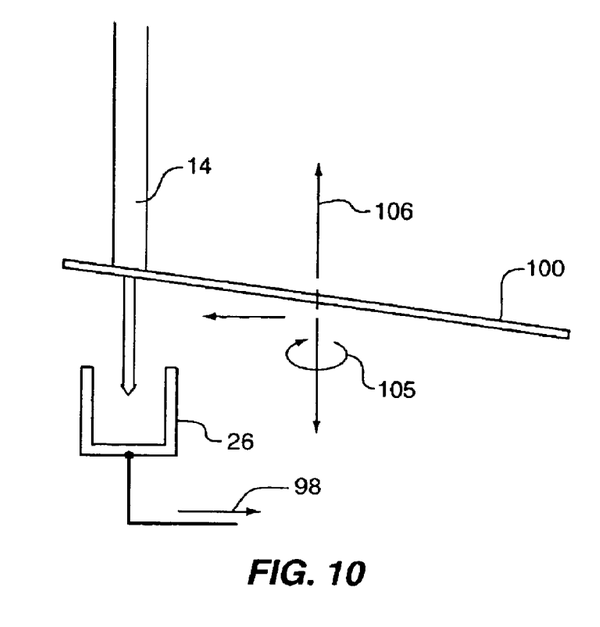
FIG. 10 illustrates the disk of FIG. 9 in use with a Faraday cup, in accord with the invention.
Figure 11:
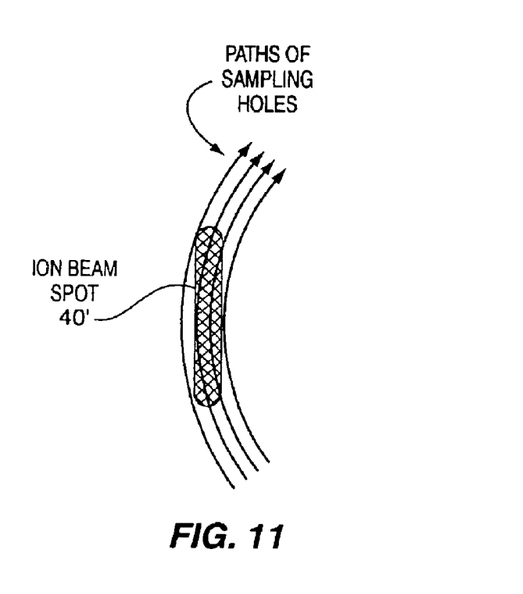
FIG. 11 shows typical sampling patterns of the disk and Faraday cup of FIGS. 9 and 10.

The determination of translational velocity needed to provide uniform dose preferably uses an accurate measurement of beam current density. Accordingly, the invention also provides a mechanism to accurately measure the density, as shown in FIGS. 9 and 10. A disk 100 in the shape of wafer 20 is used for this purpose. Disk 100 has small holes 102 that pass ion beam energy through to a Faraday cup 26 for measurement of ion current 98. The measurements are made as though an actual wafer 20 was under implantation so that an accurate measure of beam strength is made through holes 102. As such, disk 100 is rotated about center 104, shown as rotation line 105, and translated in direction 106 as above, to create a map of beam current versus scan rotation 105 and translation 107. FIG. 11 illustrates various paths 110 of four holes through the implantation spot 40', which are then used to create the map by sampling spot density in two dimensions. Four equally spaced holes 102, two along the tilt axis 72 and two orthogonal to it, are used, at least (more holes 103 could be used if desired), since the difference in beam current between them would determine the variation of the beam current density with vertical position over the range of heights produced by tilting the wafer. A calibration is also made by moving disk 100 out of the way and by measuring the full beam current of beam 14 for overall dose calibration. A computer (e.g., computer 33, FIG. 1) compiles current data from cup 26 to determine current density. Once the current density of spot 40' is known, the velocity needed for linear translation (e.g., FIG. 3) is determined by starting with a constant velocity and then performing an iterative calculation which determines radial distribution dose for the velocity profile. Once the relative velocity is known, an absolute velocity is calculated to produce the desired dose.

Those skilled in the art should appreciate that certain modifications can be made without departing from the scope of the invention. For example, ion implanters other than the type shown as system 10 of FIG. 1 can be used with the invention to provide dose uniformity correction.

The invention thus attains the objects set forth above, among those apparent from the preceding description. Since certain changes may be made in the above methods and systems without departing from the scope of the invention, it is intended that all matter contained in the above description or shown in the accompanying drawing be interpreted as illustrative and not in a limiting sense. It is also to be understood that the following claims are to cover all generic and specific features of the invention described herein, and all statements of the scope of the invention which, as a matter of language, might be said to fall there between.

Having described the invention, what is claimed is:

1. A method of implanting a wafer with an ion beam, the wafer being of the type having a surface area in the form of a disk with a diameter and center, comprising the steps of:

forming the ion beam incident on the wafer; translating the center of the wafer disk along a path intersecting the beam at a translation velocity, simultaneously rotating the wafer substantially about the center at a rotational velocity; and blanking the ion beam when the ion beam reaches the center of the wafer disk; said translation velocity, said rotational velocity and said blanking being such that the ion beam implants the wafer with substantially uniform dose across the surface area of the wafer.

2. The method of claim 1, wherein the step of translating comprises translating the wafer such that the ion beam implants from one side of the wafer to the center.

3. The method of claim 2, further comprising translating the wafer in a reverse direction back out from said center.

4. A method of implanting a wafer with an ion beam, the wafer being of the type having a surface area in the form of a disk with a diameter and center, comprising the steps of:

forming the ion beam incident on the wafer; determining a beam current density profile of the ion beam; translating the center of the wafer disk along a path intersecting the beam at a translation velocity having a translation velocity profile relative to the position of the beam across the wafer;

simultaneously rotating the wafer substantially about the center at a rotational velocity; and adjusting at least one of said translation velocity profile and said rotational velocity as a function of said ion beam current density profile such that the ion beam implants the wafer with substantially uniform dose across the surface area of the wafer.

5. A method of implanting a wafer with an ion beam, the wafer being of the type having a surface area in the form of a disk with a diameter and center, comprising the steps of:

forming the ion beam incident on the wafer; translating the center of the wafer disk along a path intersecting the beam at a translation velocity;

simultaneously rotating the wafer substantially about the center at a rotational velocity;

tilting the wafer while rotating the wafer such that the ion beam implants the surface area at a substantially constant angle relative to a crystal axis of the wafer.

6. The method of claim 5, further comprising translating the wafer in a direction substantially parallel to the ion beam such that the ion beam implants the surface area with a substantially constant spot size.

7. The method of claim 6, further comprising moving the wafer in said direction parallel to the ion beam a distance proportional to the distance between an impact location of the beam on the wafer and a plane perpendicular to the beam that passes through the center of the wafer disk, so that said impact location is maintained at a substantially constant distance along the ion beam.

8. Apparatus for ion implantation of a wafer having a surface area in the form of a disk with a diameter and a center, the apparatus comprising:

a source of a beam of ions for implanting in a wafer, a mechanism providing a beam current density profile measurement, a wafer translation driver operative to translate the center of the disk of the wafer in a direction intersecting the ion beam from said source at a translation velocity having a translation velocity profile relative to the position of the beam across the wafer, a wafer rotation driver operative to rotate the wafer about a rotation axis through the center parallel to the ion beam at a rotational velocity, simultaneously with translation of the wafer across the beam by said translation driver, and a controller to operate said translation driver and said rotation driver so that at least one of said translation velocity profile and said rotational velocity is adjusted as a function of the measured beam current density profile to provide a substantially uniform dose implanted by the ion beam over the surface area of the wafer.

9. Apparatus for ion implantation of a wafer having a surface area in the form of a disk with a diameter and a center, the apparatus comprising:

a source of a beam of ions for implanting in a wafer, a wafer translation driver operative to translate the center of the disk of the wafer in a direction intersecting the ion beam from said source at a translation velocity, a wafer rotation driver operative to rotate the wafer about a rotation axis through the center parallel to the ion beam at a rotational velocity, simultaneously with translation of the wafer across the beam by said translation driver, and a tilt axis about which the wafer can be tilted so that the wafer normal is at an angle to the ion beam, said tilt axis rotating with rotation of the wafer about said rotation axis so that the angle of the ion beam relative to the crystal axis of the wafer does not vary with different rotational positions of the wafer about the rotation axis.

10. Apparatus as claimed in claim 9 and including a further translation drive to translate the wafer substantially parallel to the ion beam to keep the impact point of the ion beam on the wafer at a substantially constant position along the ion beam.

* * * * *